(12) United States Patent
Toyoshima

(10) Patent No.: US 11,372,328 B2
(45) Date of Patent: Jun. 28, 2022

(54) MOLD, IMPRINTING APPARATUS, AND METHOD FOR MANUFACTURING ARTICLE

(71) Applicant: CANON KABUSHIKI KAISHA, Tokyo (JP)

(72) Inventor: Takahiro Toyoshima, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 136 days.

(21) Appl. No.: 17/003,615

(22) Filed: Aug. 26, 2020

(65) Prior Publication Data
US 2021/0055650 A1  Feb. 25, 2021

(30) Foreign Application Priority Data
Aug. 19, 2019 (JP) ............... JP2019-149837

(51) Int. Cl.
    *G03F 7/00* (2006.01)
(52) U.S. Cl.
    CPC .................. *G03F 7/0002* (2013.01)
(58) Field of Classification Search
    None
    See application file for complete search history.

(56) References Cited

U.S. PATENT DOCUMENTS

| 7,179,079 B2 | 2/2007 | Sreenivasan et al. |
| 2005/0051698 A1* | 3/2005 | Sreenivasan ........... B82Y 40/00 249/135 |

FOREIGN PATENT DOCUMENTS

| JP | 2018-190844 A | 11/2018 |
| JP | 2018190844 A | * 11/2018 |

* cited by examiner

*Primary Examiner* — Alexander M Weddle
(74) *Attorney, Agent, or Firm* — Carter, DeLuca & Farrell LLP

(57) ABSTRACT

To perform efficient releasing even if a force applied to the mold is reduced, provided is a mold which is used in an imprinting apparatus, for molding an imprinting material by imprinting the imprinting material on a substrate with an imprinting surface of the mold, and is released by applying a force in a releasing direction to a peeling region near an outer periphery of the mold, wherein a flexibility of the peeling region of the mold is higher than that of other portions near the outer periphery of the mold.

16 Claims, 8 Drawing Sheets

MOLD, IMPRINTING APPARATUS, AND METHOD FOR MANUFACTURING ARTICLE

BACKGROUND OF THE INVENTION

Field of the Invention

The present invention relates to a mold, an imprinting apparatus, and a method for manufacturing an article.

Description of the Related Art

As one of lithography technologies for manufacturing an article such as a semiconductor device, an imprinting technology is known. When the imprinting technology is used, a pattern (a structure) of a nanometer order can be formed by transferring the pattern of a mold to an imprinting material (a resin) on a substrate.

In an imprinting apparatus that employs a photo-curing method of the imprinting technology, first, a photo-curable imprinting material is supplied onto the substrate. Next, the imprinting material is molded by imprinting the mold on the imprinting material. Then, the molded imprinting material is irradiated with light to cure the imprinting material. By releasing the mold, the pattern can be formed on the substrate.

U.S. Pat. No. 7,179,079 discloses a technology in which a groove is formed in a non-imprinting surface to make an imprinting surface of the mold follow the shape of the substrate when imprinting. Further, Japanese Patent Laid-Open No. 2018-190844 discloses a technology in which a thickness of a core-out portion (a pattern periphery) is changed depending on a location to remove bubbles remaining in a groove of a pattern portion of the mold when imprinting, and to shorten a filling time. For that purpose, in Japanese Patent Laid-Open No. 2018-190844, an outer periphery of the mold is made thicker than the other portion of the mold. As explained above, these technologies are for improving the problem in an imprinting step by forming a groove in a location on a back side of the pattern portion or the pattern periphery and partially changing a thickness of the mold.

On the other hand, in recent years, the imprinting technology has been expanding applications other than those for forming a pattern for each shot, and is going to be applied to a flattening technology called inkjet-based adaptive planarization (TAP).

Unlike the mold used in the imprinting of the related art, the mold used in IAP is constituted by a flat plate having a large size of about 0300 mm and does not have even the core-out portion. By imprinting such a mold on the imprinting material on the substrate all at once, a flattened layer can be formed on the substrate.

Compared to the imprinting of the related art in which a pattern is formed for each shot, in TAP, an area for one-time imprinting is large, resulting in a new problem that a force required for releasing is also large. Therefore, it is necessary to smoothly separate the mold from the imprinting material on the substrate, which should be performed in a releasing step of the related art.

Therefore, an object of the present invention is to provide a mold that can be smoothly released from an imprinting material.

SUMMARY OF THE INVENTION

To achieve the object, according to an aspect of the present invention, there is provided a mold which is used in an imprinting apparatus, for molding an imprinting material by imprinting the imprinting material on a substrate with an imprinting surface of the mold, and is released by applying a force in a releasing direction to a peeling region near an outer periphery of the mold, wherein a flexibility of the peeling region of the mold is higher than that of other portions near the outer periphery of the mold.

Further features of the present invention will become apparent from the following description of exemplary embodiments with reference to the attached drawings.

DESCRIPTION OF THE EMBODIMENTS

Hereinafter, preferred embodiments of the present invention will be described in detail with reference to the attached drawings and examples.

Embodiment 1

Figure 1:
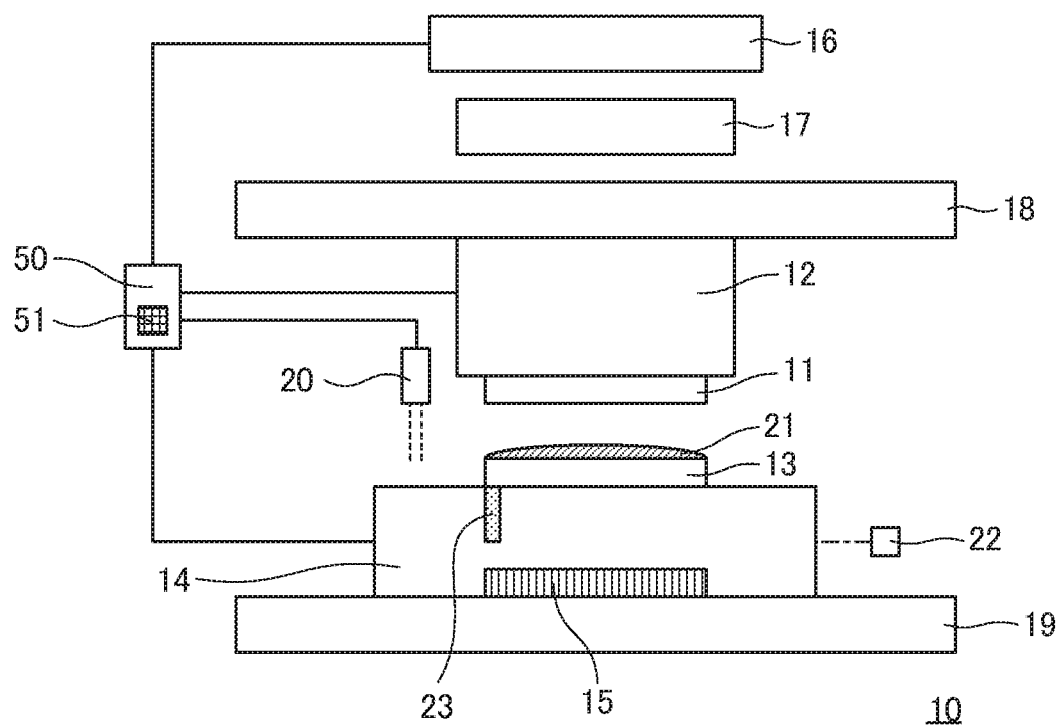
FIG. 1 is a view showing an example of an imprinting apparatus.

FIG. 1 is a view of an imprinting apparatus. The imprinting apparatus 10 is an apparatus that is used for manufacturing an article such as a semiconductor device to form a pattern on a processing target substrate by bringing an imprinting surface of a mold 11 into contact (pressing) with an imprinting material 21 on the substrate. Further, the imprinting technology is not limited to the imprinting for each shot of the related art, and can be applied to a flattening technology called IAP. Here, since flatness can also be regarded as one of the patterns, the pattern used in the following description includes flatness, and further, pattern formation (molding) includes imprinting (contact) for flattening.

The imprinting apparatus 10 includes a head 12 supported by a structure 18 and holds the mold 11 having a flat surface for flattening the imprinting material or a pattern surface of a circuit pattern and the like on a lower side thereof. The head 12 can move the mold 11 toward and away from a substrate 13 (vertical directions in the figure) to bring the mold 11 and the imprinting material 21 into contact with each other (imprinting) and separate (release) the mold from the imprinting material with a drive source (not shown) and a control unit 50. A substrate stage 14 holding the substrate 13 can be moved to an arbitrary position on a stage surface plate 19 by a drive mechanism 15. The control unit 50 includes a recording unit 51 that records measured values of positions of the head 12 and the substrate stage 14. Further, the control unit 50 has a built-in CPU as a computer, and functions as a control means for executing various operations of the entire apparatus based on a computer program stored in a memory (not shown).

When the imprinting material 21 is supplied to the substrate 13, the substrate stage 14 is moved so that an imprinting region is located immediately below an ejecting unit (a dispenser) 20, and the imprinting material 21 is supplied (ejected) from the ejecting unit 20. As a method for supplying the imprinting material 21 onto the substrate 13, in FIG. 1, as described above, one head 12 is provided for one ejecting unit 20, however a plurality of heads 12 or a plurality of substrate stages 14 may be provided for one ejecting unit 20. Alternatively, the imprinting material 21 may be applied to the substrate 13 in advance using an external apparatus or a dedicated unit, and then the substrate 13 to which the imprinting material has been applied may be conveyed to the substrate stage 14.

When the mold 11 is imprinted (pressed) on the imprinting material 21, the substrate stage 14 is moved so that the imprinting region to which the imprinting material 21 is supplied is located immediately below the mold 11. At this time, the position of the substrate stage 14 in a planar direction is measured by a stage length measuring unit 22, and the substrate stage 14 is aligned by a control mechanism and an alignment mechanism (not shown). Then, the head 12 holding the mold 11 is driven toward the substrate 13 to bring the mold 11 into contact with the imprinting material 21 (imprinting).

After that, to cure the imprinting material 21 molded on the substrate 13, exposure light emitted from an ultraviolet light source 16 is guided by an illumination optical system 17 and the imprinting material 21 contacting with the mold 11 is irradiated with the exposure light that has been transmitted through the transparent mold 11. The imprinting material 21 is a photo-curable composition having a property of being cured by receiving ultraviolet rays, and the composition is appropriately selected according to various conditions such as a semiconductor device manufacturing process. If a thermosetting method is employed, a heat source such as a heater built in a mold holding unit is used, and a composition for the imprinting material 21 to be cured depending on the temperature is appropriately selected.

When the mold 11 is released from the imprinting material 21, the head 12 holding the mold 11 is driven away from the substrate 13 (upward in the figure). At this time, particularly in TAP, since an area for one-time imprinting is large, a force required for releasing is also large, and thus the releasing may be sometimes difficult only with the drive of the head 12. Alternatively, the mold 11 may sometimes be detached from the head 12, or the substrate 13 may sometimes be detached from the substrate stage 14. Therefore, in the present example, in addition to the upward drive of the head 12, a biasing portion such as a lift pin (a protrusion) 23 is provided in the substrate stage 14, projects upward from an inside of, for example, a V-shaped notch portion 230 (a cutout) provided in the substrate 13 in advance. Then, the lift pin 23 performs releasing by applying a force in a releasing direction to the imprinting surface of the mold 11 from the inside of the notch portion while avoiding contacting the substrate. That is, it is characterized in that the lift pin 23 is disposed inside the notch portion of the substrate as a protrusion, and the lift pin 23 applies a force to a peeling region near an outer periphery of the mold in the releasing direction from an imprinting surface side. Although the lift pin 23 as the biasing portion has a pin shape in this embodiment, it may have shapes other than the pin shape such as a protrusion. In addition, a plurality of lift pins may be provided at a plurality of positions of the substrate stage 14, and a plurality of notches may be disposed on the substrate, or peripheral portion of the mold may overhang from the substrate, so that a plurality of peripheral portions of the mold may be lifted up by the plurality of lift pins.

Figure 2A:
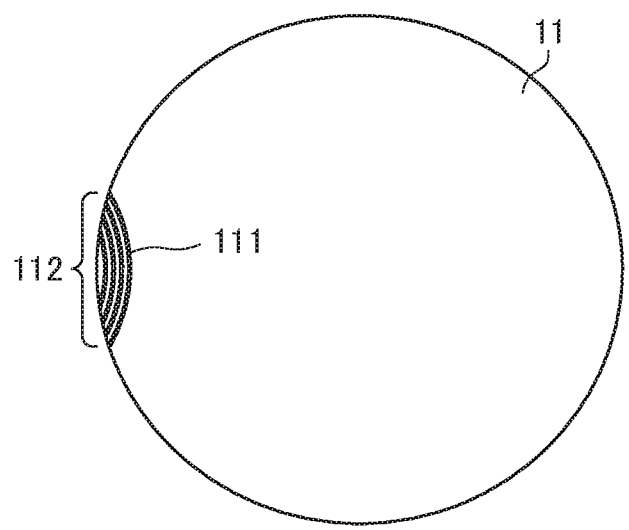
FIG. 2A is a view of the mold 11 from a non-imprinting surface.
Figure 2B:
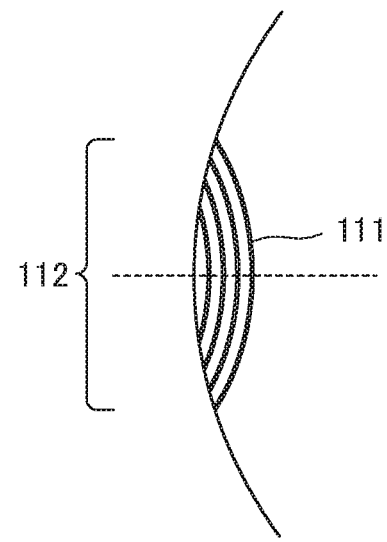
FIG. 2B is an enlarged view of the grooves 111 of the mold 11 of FIG. 2A.
Figure 2C:
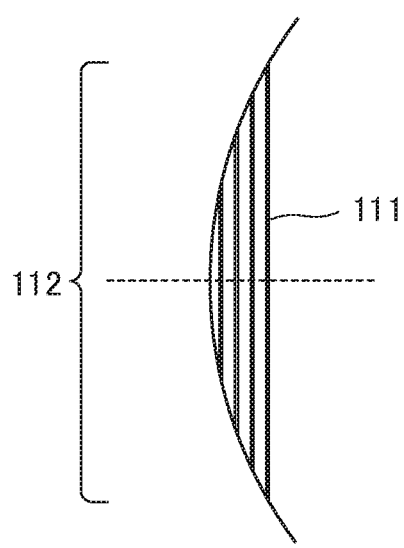
FIG. 2C is an enlarged view of another type of the grooves 111 of the mold 11 of FIG. 2A.

FIG. 2A is a view of the mold 11 from a non-imprinting surface, and grooves 111 are provided in the peeling region 112 of the non-imprinting surface in an outer peripheral end of the mold 11. Preferably, the grooves 111 are provided in the peeling region 112 within a range of 10 mm from the outer peripheral end of the mold 11. The peeling region 112 is provided on a molding surface on a side opposite to a position where the lift pin 23 comes into contact with the mold, and the peeling region 112 and the grooves 111 are provided to be substantially axisymmetric with respect to a straight line connecting the position where the lift pin comes into contact with the mold and a center of the mold. FIGS. 2B and 2C are enlarged views of the grooves 111 of the mold 11 of FIG. 2A. The grooves are cut in the mold 11 in a direction approximately orthogonal to a direction in which peeling of the imprinting material 21 progresses at the time of releasing (a direction of a straight line connecting the position where the lift pin comes into contact with the mold and a center of the mold).

Figure 2D:
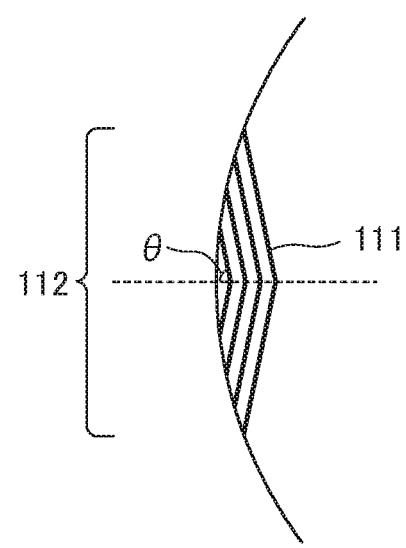
FIG. 2D is an enlarged view of another different type of the grooves 111 of the mold 11 of FIG. 2A.

In other words, the grooves are cut along peeling curves of the mold formed at plural timings while the mold is gradually peeled from the imprinting material. Specifically, as shown in FIG. 2B, the grooves of the peeling region 112 of the mold 11 have an arc shape centered on a predetermined point on a straight line connecting the position where the lift pin comes into contact with the mold and a center of the mold. Alternatively, as described above, the grooves may be cut in a direction substantially orthogonal to a direction of a straight line connecting the position of the mold with which the lift pin comes into contact and a center of the mold as shown in FIG. 2C. However, as shown in FIG. 2D, the grooves may be provided to be axisymmetric and to have a slightly acute angle θ with respect to a straight line connecting the position where the lift pin comes into contact with the mold and a center of the mold. Generally, the grooves should be configured to intersect and to be axisymmetric with respect to a straight line connecting the position where the lift pin comes into contact with the mold and a center of the mold.

By forming such grooves, the flexibility of the peeling region near the outer periphery of the mold can be made higher than that of other portions near the outer periphery of the mold, and thus if a force for releasing is applied to the mold by the biasing portion such as the lift pin or the like, damage to the mold can be reduced, and the mold can be released smoothly. Note that groove shapes may include a grid shape in which grooves in different directions intersect each other, a periodic or random shape, uneven shape, fine or rough shape, and the like.

Figure 3A:
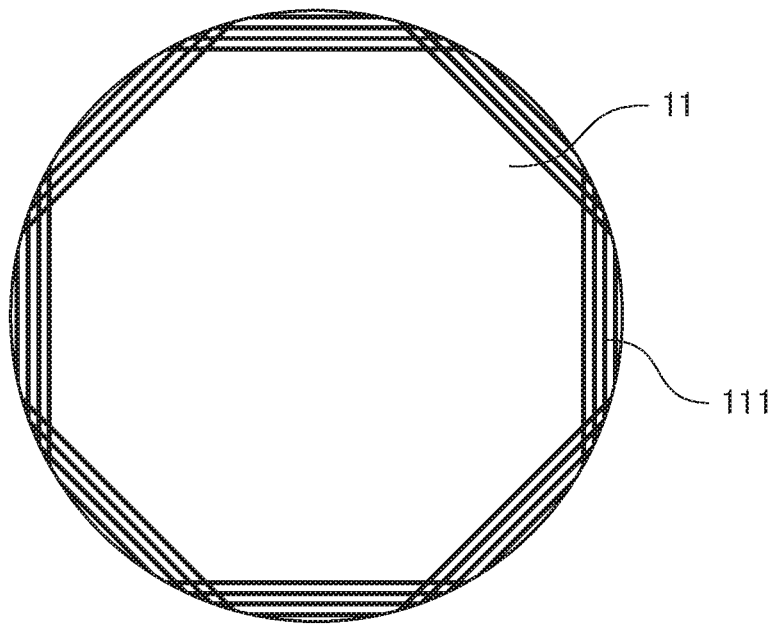
FIG. 3A is a view showing a mold in which one type of grooves is provided over the entire outer peripheral end.
Figure 3B:
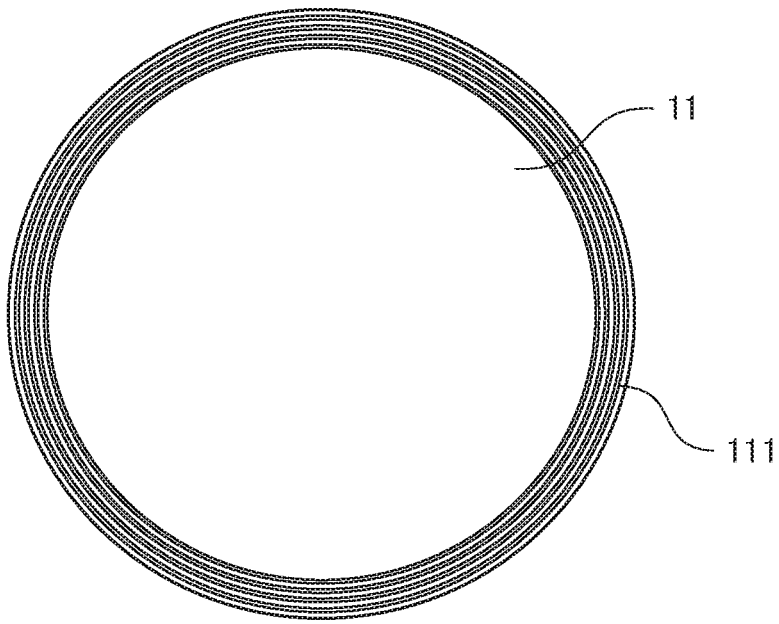
FIG. 3B is a view showing a mold in which another type of grooves is provided over the entire outer peripheral end.

Further, the grooves 111 may be provided not only in the peeling region 112 of a part of the outer periphery of the mold but also in the entire outer peripheral end of the mold as shown in FIG. 3A, and may have circular shapes centered on a center of the mold 11 as shown in FIG. 3B.

If the grooves 111 are provided in the entire region of the outer peripheral end, the mold 11 can be disposed in a plurality of directions or an arbitrary direction. Accordingly, it is possible to appropriately change the position of the mold coming into contact with the lift pin 23, and it is possible to reduce the number of times contact and bending occur, so that damage such as scratches and fatigue fracture of the mold 11 can be reduced and the life span of the mold can be extended.

Figure 4A:
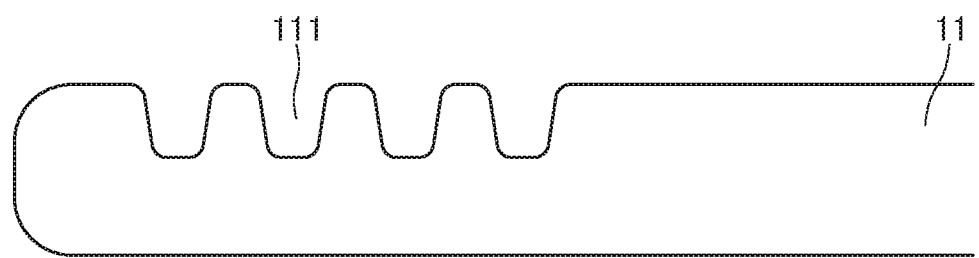
FIG. 4A is a cross-sectional view of the mold 11 along a dotted line in FIG. 2
Figure 4B:
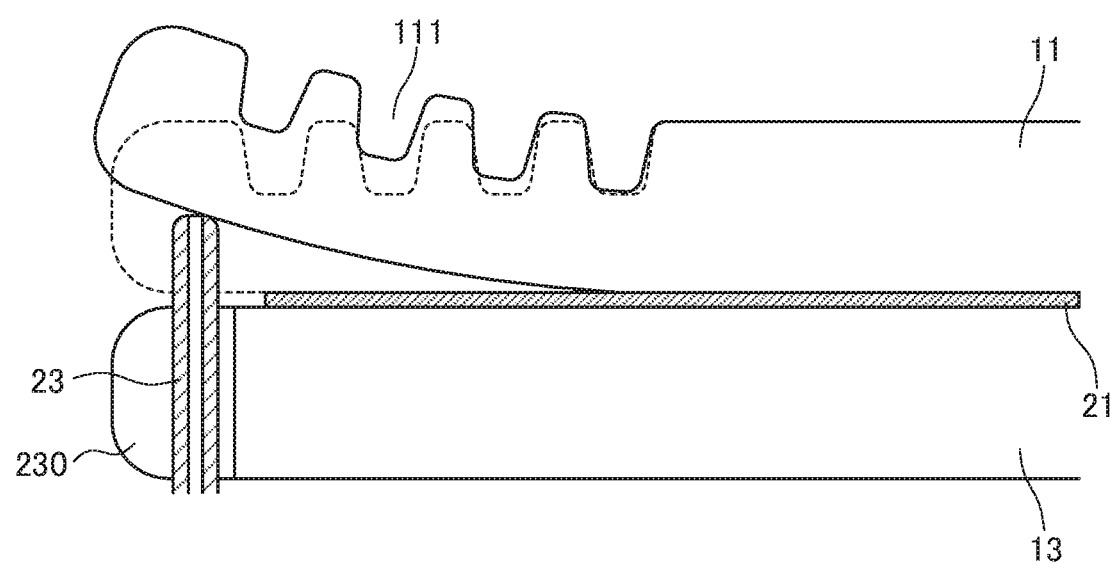
FIG. 4B is a view in which the lift pin 23 is lifted up through the notch portion 230.

FIG. 4A is a cross-sectional view of the mold 11 along a dotted line in FIG. 2 (a straight line connecting the position where the lift pin comes into contact with the mold and a center of the mold). Note that a depth of the groove is preferably equal to or less than half a thickness of the mold 11. FIG. 4B is a view in which the lift pin 23 is lifted up through the notch portion 230 (a region cut out in a V-shape when the substrate is viewed from the top side) of the substrate 13 without contacting the notch portion 230 and a force is directly applied to the peeling region 112 of the imprinting surface of the mold 11.

The grooves 111 are provided at a position on a back side of the mold corresponding to a location where the lift pin 23 applies a force to the mold 11, and the applied force is propagated to the grooves 111 to bend the mold 11 and to promote releasing between the mold 11 and the imprinting material 21. Therefore, a great effect can be obtained by disposing the grooves 111 of the mold 11 around a position of the mold on a side opposite to the position where the lift pin 23 provided on the substrate stage 14 of the imprinting apparatus 10 comes into contact with the mold.

The imprinting apparatus detects a position of the peeling region 112 or a reference portion of the mold with a sensor or the like so that the position of the peeling region 112 is on a side opposite to the position of the lift pin 23, and conveys and attaches the mold to the head 12. If grooves are provided at a plurality of locations or over the entirety of the outer periphery of the mold, an angular position of the mold and the number of times the releasing operation is performed are stored in a memory, and after a predetermined number of times, the angular position may be shifted when the mold is attached to the head 12.

As a method for the lift pin 23 to apply a force to the mold 11 without contacting the substrate 13, the mold 11 may be manufactured to have a larger diameter than the substrate 13 to overhand the substrate as a whole, or a region where the mold 11 and the substrate 13 do not overlap may be formed when performing imprinting by offsetting the centers of the mold 11 and the substrate 13 each other. Further, since the lift pin 23 may generate dust by pressing the mold 11, it is desirable to provide a suction mechanism at a tip of the lift pin 23 or around the lift pin.

Figure 5:
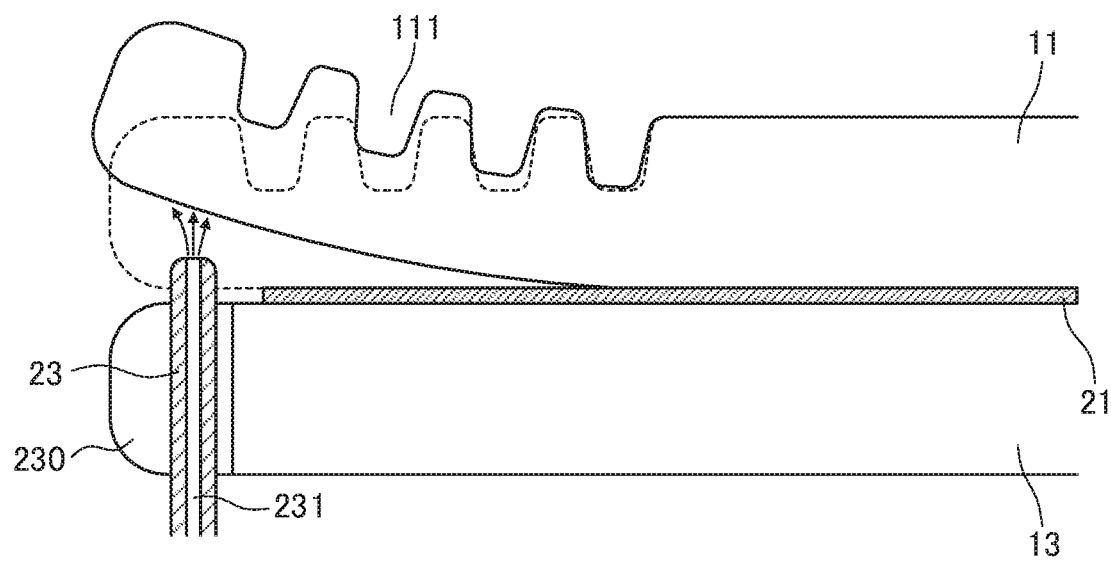
FIG. 5 is a view showing an example of a releasing method using a gas.

Further, as a method of reducing damage and dust generation of the mold 11, as shown in FIG. 5, a flow path 231 for ejecting gas may be formed in the lift pin 23. The gas is ejected from the tip of the lift pin 23 to the mold 11 to add pressure to the imprinting surface, which promotes the releasing.

In that case, for example, the lift pin 23 may be pressed against the mold while simultaneously blowing gas. Alternatively, only one may be operated first and the other may be operated later. Further, the flow path 231 may be configured to switch the operation so that the flow path blows the gas when promoting the releasing and the flow path performs a suction operation when sucking dust. By forming the flow path 231 as a blower in this way, damage to the mold 11 and dust generation can be reduced. Note that the releasing/peeling may be performed only by blowing the gas through the flow path 231 while the lift pin 23 does not directly contact with the mold.

Figure 6:
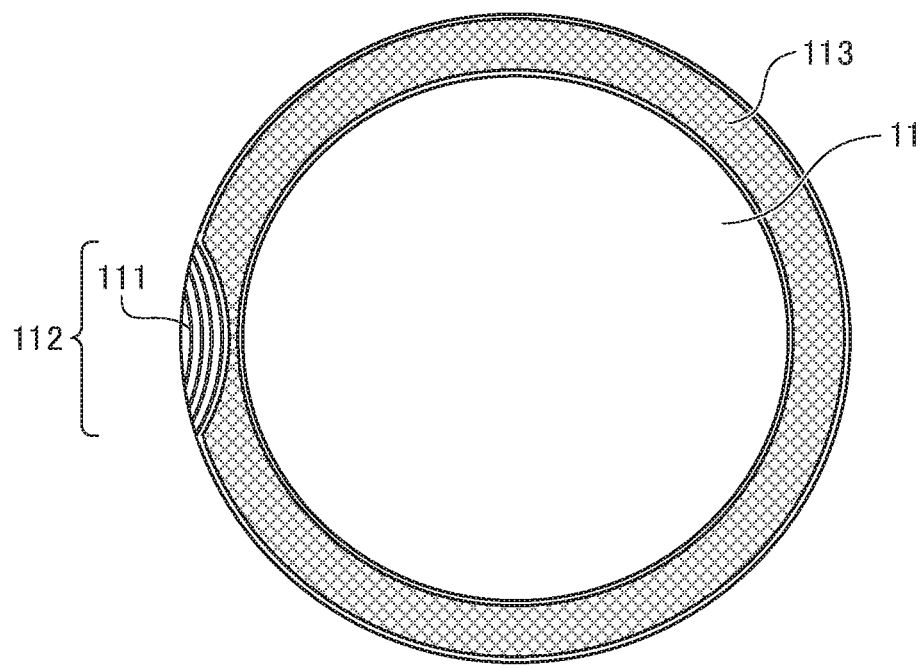
FIG. 6 is a view of the mold from a non-imprinting surface side.

FIG. 6 is a view of the mold 11 from a non-imprinting surface side, and a suction region 113 to be sucked and held by the head 12 is shown by diagonal grid lines. Note that, in FIG. 6, a surface of the suction region 113 (that is, a surface other than the peeling region 112) is displayed in a grid pattern for convenience, but in actuality, the surface is flat so that the head 12 can efficiently suction-hold the mold. At the time of releasing, a force is applied to the imprinting surface of the mold 11 by the lift pin 23, and the peeling region 112 of the mold 11 is peeled away from the substrate 13 while the mold 11 is suction-held by a suction portion 115 of the head 12 as shown in FIG. 8. Note that, since the peeling region 112 is pushed up by the lift pin, the suction portion 115 is disposed to suck the suction region 113 other than the peeling region 112. An elastic body may be provided at a tip of the suction portion 115, and if the amount of bending of the elastic body is sufficiently large, the suction portion 115 may suck the peeling region 112 and the suction region 113 together.

Figure 7A:
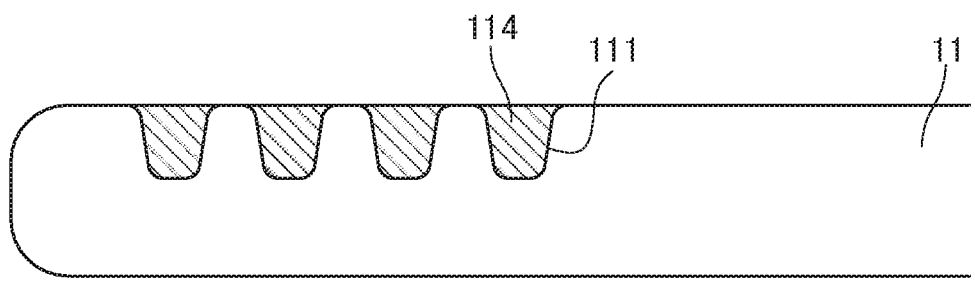
FIG. 7A is a view showing a mold in which a filler is filled in mold grooves.
Figure 7B:
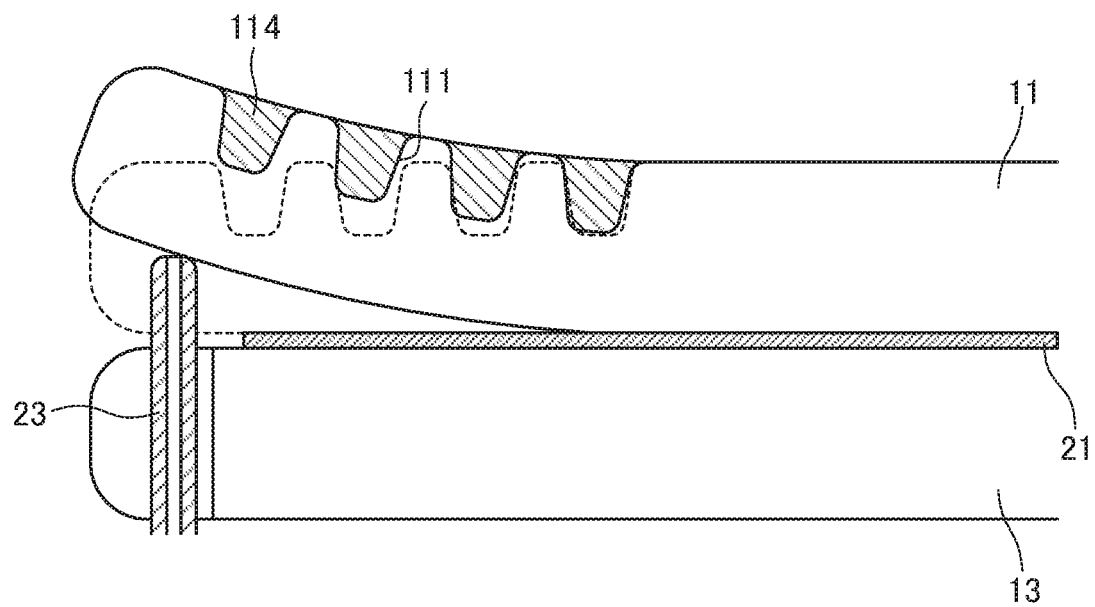
FIG. 7B is a view showing a mold in which a filler is filled in mold grooves is bent when the lift pin 23 is lifted up

FIGS. 7A and 7B are views showing an example in which the grooves 111 of the mold 11 are filled with a filler 114 made of a material different from a material of the mold 11. The force applied by the lift pin 23 is propagated to the grooves 111 of the mold 11 to bend the mold 11 and to promote the releasing between the mold 11 and the imprinting material 21, while the providing grooves may cause the mold 11 to be damaged depending on the material of the mold. Therefore, to make the mold 11 easier to bend and less likely to be damaged, the grooves 111 of the mold 11 may be filled with the filler 114 made of a material having a smaller Young's modulus than the material of the mold 11. Note that, in the example, the flexibility of the peeling region of the non-imprinting surface is made higher than that of other portions by providing the grooves and the like in the peeling region of the non-imprinting surface, however, the flexibility of the peeling region of the mold may be made higher than that of the other portions near the outer periphery of the mold by making a thickness of the peeling region of the mold thinner than that of other portions. Alternatively, by forming the grooves on the imprinting surface side of the peeling region, the flexibility of the peeling region may be made higher than that of other portions near the outer periphery of the mold (portions other than the peeling region of the mold near the outer periphery of the mold). In that case, the grooves on the imprinting surface side may be filled with the filler 114 made of a material having a smaller Young's modulus than the material of the mold 11.

Embodiment 2

Figure 8A:
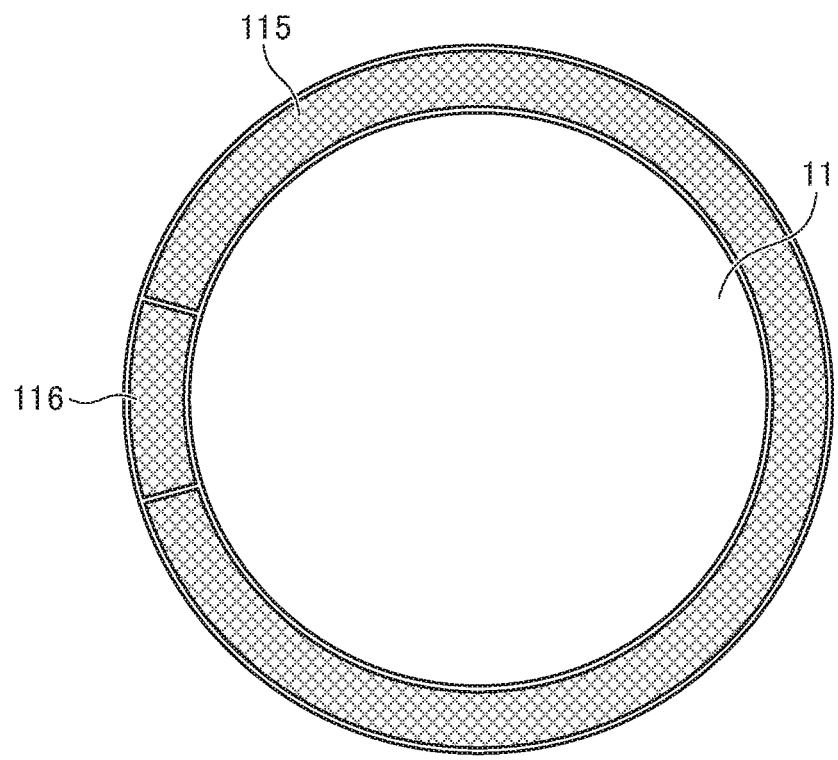
FIG. 8A is a view for showing the suction portions 115 and 116 in Embodiment 2.

FIG. 8 is a view for showing the suction portions 115 and 116 in Embodiment 2. As shown in FIG. 8A, to suck the mold from the non-imprinting surface side, the suction portion 115 for sucking the suction region 113 is provided to face the suction region 113 other than the peeling region 112. That is, the suction portion 115 constitutes a first suction portion for sucking a region other than the peeling region.

Further, a suction portion 116 (a second suction portion) functioning as a biasing portion, which is for sucking the peeling region 112 is provided to face the peeling region 112 of the mold. Further, the suction portion 115 and the suction portion 116 are configured to be driven independently. Note that the suction portion 115 and the suction portion 116 respectively suck the suction region 113 and the peeling region 112 of the mold 1.

Figure 8B:
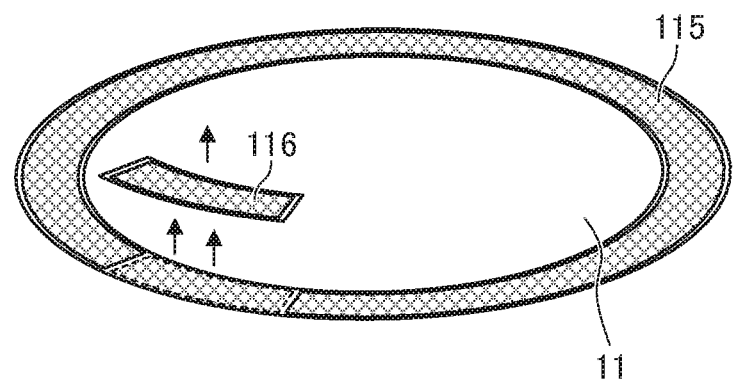
FIG. 8B is a view for showing heights of the suction portions 115 and 116 in Embodiment 2 when the peeling region 112 is peeled up.

When the mold 11 is released from the imprint material 21 on the substrate 13, the suction portion 116 facing the peeling region 112 sucks with a suction force per unit area stronger than a suction force per unit area of the suction portion 115. Thereby, the mold 11 is released from the imprint material 21 on the substrate 13. Then, the entire mold 11 is moved in a direction of being released from the imprint material 21 on the substrate 13 while the suction portion 116 is sucked more strongly than the suction portion 115. Therefore, as shown in FIG. 8B, the suction portion 116 has a large upward movement amount so that the peeling region 112 can be moved above a suction position of the suction portion 115 while sucking the peeling region 112.

Note that when the mold 11 is released from the imprint material 21 on the substrate 13 by using the suction portion 116, for example, the lift pin 23 may perform pushing-up from below at the same time, or the blower may add air pressure to promote pushing-up (biasing) from below and the releasing together at the same time. That is, it is sufficient if the releasing is promoted by using at least one of the suction portion 116, the lift pin 23, and the blower.

Here, each of the suction portion 116, the blower and the lift pin 23 functions as a biasing portion.

FIG. 9 is a view showing a structural example of the non-imprinting surface of the mold corresponding to the configuration of the suction portions 115 and 116 of FIG. 8.

Figure 9A:
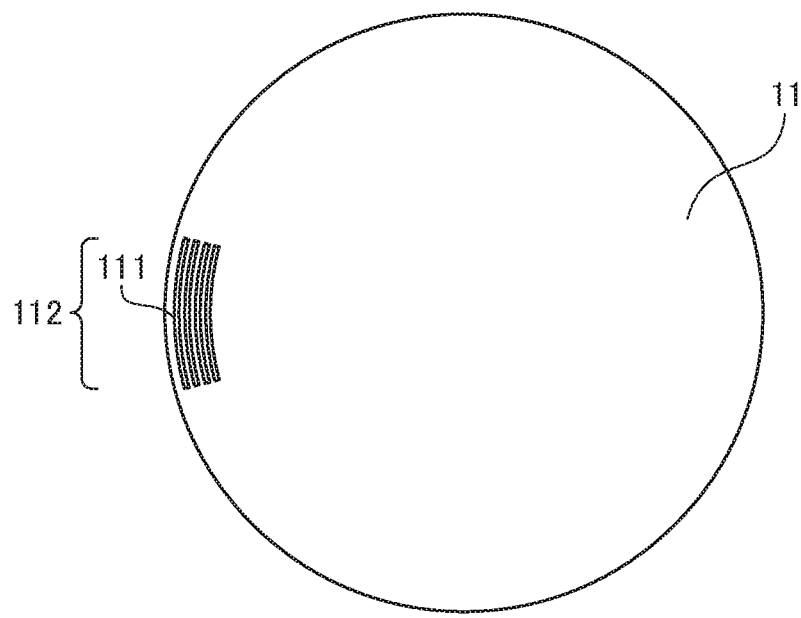
FIG. 9A is a view showing yet another example of a mold suction region. 9B is a view showing a positional relationship between the non-imprinting surface of the mold and the suction portions 115 and 116 in an overlapping manner.

In FIG. 9A, a peeling region 112 facing the suction portion 116 in the non-imprinting surface of the mold is shown, and a surface other than this peeling region 112 is a flat surface. The peeling region 112 is provided with the grooves 111 as shown in FIG. 2. In FIG. 9, the grooves 111 are provided only in a portion facing the suction portion 116. Further, FIG. 9B is a view showing a positional relationship between the non-imprinting surface of the mold and the suction portions 115 and 116 in an overlapping manner.

Figure 9B:
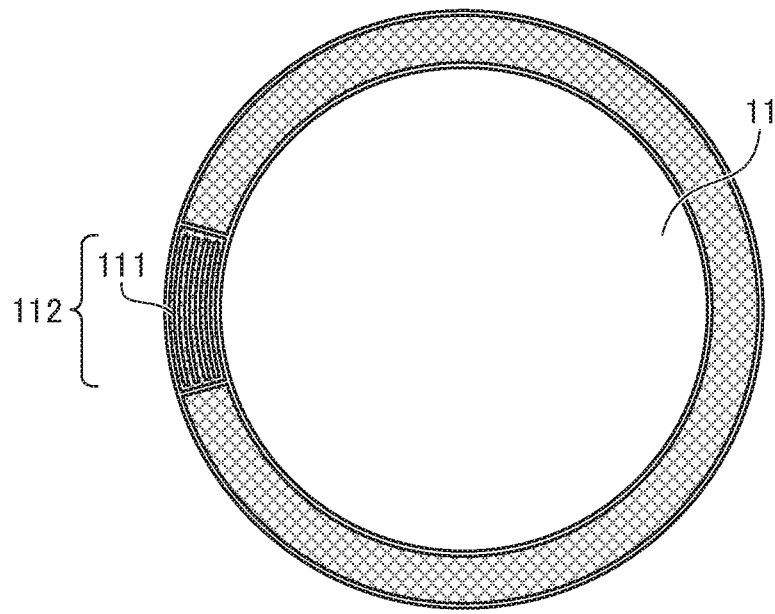

As shown in FIG. 9B, the grooves 111 are configured such that both ends of each groove do not come out from a facing surface of the suction portion 116. That is, both ends of the grooves are covered with the suction portion 116. This is to prevent a suction force of the suction portion 116 from leaking from the ends of the grooves 111. Since both ends of the grooves are covered with the suction portions 116 as described above, the mold 11 can be efficiently released (peeled) from the substrate 13, while the peeling region 112 is more flexible than other portion near an outer periphery of the mold.

Next, a method of manufacturing an article (a semiconductor IC element, a liquid crystal display element, MEMS, or the like) using the above-described mold will be described. The article is manufactured by executing a post-process (a process of manufacturing an article from the imprinted substrate) after a step of imprinting the substrate on which the imprinting material is applied by using the above-mentioned mold and a step of releasing the mold from the imprinting material. The post-process includes etching, resist peeling, dicing, bonding, packaging, and the like. According to the article manufacturing method using the present invention, since the releasing can be smoothly performed, the yield is improved and the article of higher quality can be manufactured.

Note that a computer program that realizes the functions of the above-described examples in which a part or all of the control in the present example has been described may be supplied to the imprinting apparatus via a network or various storage mediums. Further, a computer (or CPU, MPU, or the like) in the imprinting apparatus may read and execute the program. In that case, the program and the storage medium storing the program constitute the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-149837 filed on Aug. 19, 2019, which is hereby incorporated by reference herein in its entirety.

What is claimed is:

1. A mold which is used in an imprinting apparatus, for molding an imprinting material by imprinting the imprinting material on a substrate with an imprinting surface of the mold, and is released by applying a force in a releasing direction to a peeling region near an outer periphery of the mold,
wherein a flexibility of the peeling region of the mold is higher than that of other portions near the outer periphery of the mold.

2. The mold according to claim 1, wherein a groove is formed in the peeling region to make the flexibility of the peeling region higher than that of other portions near the outer periphery of the mold.

3. The mold according to claim 2, wherein the groove is formed in a direction intersecting a direction in which the mold is peeled from the imprinting material when a force in the releasing direction is applied to the peeling region.

4. The mold according to claim 2, wherein the groove is filled with a predetermined filler after the groove is formed.

5. The mold according to claim 4, wherein the material of the filler has a Young's modulus lower than a Young's modulus of the material of the mold.

6. The mold according to claim 2, wherein a depth of the groove is equal to or less than half a thickness of the mold.

7. The mold according to claim 2, wherein the peeling region is provided within a range of 10 mm from an outer peripheral end of the mold.

8. The mold according to claim 1, wherein the peeling region is provided over an entire outer peripheral end of the mold.

9. The mold according to claim 1, wherein, in a surface of the mold on a side opposite to the imprinting surface, a surface other than the peeling region is flat.

10. An imprinting apparatus comprising:
a mold holding unit which holds a mold in which a peeling region is provided near an outer periphery of the mold and a flexibility of the peeling region is higher than that of other portions near the outer periphery of the mold, wherein the mold is for molding an imprinting material by imprinting the imprinting material on a substrate with an imprinting surface of the mold, and wherein the mold is released by applying a force in a releasing direction to the peeling region; and a biasing portion for applying a force in the releasing direction to the peeling region of the mold from the imprinting surface side of the mold when releasing is performed.

11. The imprinting apparatus according to claim 10, wherein the biasing portion includes a protrusion disposed inside a notch portion provided in the substrate.

12. The imprinting apparatus according to claim 11, wherein the protrusion has a blower for blowing gas from the imprinting surface side of the mold in the releasing direction.

13. The imprinting apparatus according to claim 10, wherein the biasing portion has a blower that blows gas to apply a force in the releasing direction to the peeling region of the mold from the imprinting surface side of the mold when releasing is performed.

14. The imprinting apparatus according to claim 10, further comprising: a first suction portion for sucking portions other than the peeling region, in a surface of the mold on a side opposite to the imprinting surface.

15. The imprinting apparatus according to claim 14, wherein the biasing portion includes a second suction portion for sucking the peeling region in the surface of the mold on a side opposite to the imprinting surface, and the second suction portion applies a suction force stronger than a suction force of the first suction portion when releasing is performed.

16. A method for manufacturing an article by using an imprinting apparatus including a mold holding unit which holds a mold in which a peeling region is provided near an outer periphery of the mold and a flexibility of the peeling region is higher than that of other portions near the outer periphery of the mold, wherein the mold is for molding an imprinting material by imprinting the imprinting material on a substrate with an imprinting surface of the mold, and wherein the mold is released by applying a force in a releasing direction to the peeling region; and a biasing portion for applying a force in the releasing direction to the peeling region of the mold from the imprinting surface side of the mold when the releasing is performed, the method comprising:

imprinting the imprinting material on the substrate by the mold; and releasing the mold from the imprinting material.

\* \* \* \* \*